(12) United States Patent
Muramoto et al.

(10) Patent No.: US 8,779,844 B2
(45) Date of Patent: Jul. 15, 2014

(54) SEMICONDUCTOR INTEGRATED CIRCUIT

(75) Inventors: Mai Muramoto, Kamakura (JP);
Takatoshi Minamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 13/323,040

(22) Filed: Dec. 12, 2011

(65) Prior Publication Data
US 2012/0306570 A1 Dec. 6, 2012

(30) Foreign Application Priority Data
Jun. 1, 2011 (JP) .................................. 2011-123502

(51) Int. Cl.
*G05F 1/10* (2006.01)
*G05F 3/02* (2006.01)

(52) U.S. Cl.
USPC .......................................... 327/536; 257/299

(58) Field of Classification Search
USPC ............................................ 327/536; 257/299
See application file for complete search history.

(56) References Cited

U.S. PATENT DOCUMENTS

| 5,892,267 A | 4/1999 | Takada | |
|---|---|---|---|
| 6,175,264 B1 * | 1/2001 | Jinbo | 327/536 |
| 6,747,897 B2 * | 6/2004 | Karaki | 365/185.18 |
| 7,345,335 B2 * | 3/2008 | Watanabe | 257/314 |
| 7,761,831 B2 * | 7/2010 | Mai et al. | 327/334 |
| 2003/0057510 A1 * | 3/2003 | Ishii | 257/452 |
| 2007/0157144 A1 | 7/2007 | Mai et al. | |

FOREIGN PATENT DOCUMENTS

| JP | 9-331671 | | 12/1997 |
|---|---|---|---|
| JP | 2001085633 A | * | 3/2001 |
| JP | 2005-353760 | | 12/2005 |
| JP | 2009-521811 | | 6/2009 |

OTHER PUBLICATIONS

Office Action issued May 15, 2012 in Japanese Application No. 2011-123502 (With English Translation).

* cited by examiner

*Primary Examiner* — Quan Tra
(74) *Attorney, Agent, or Firm* — Oblon, Spivak, McClelland, Maier & Neustadt, L.L.P.

(57) ABSTRACT

A semiconductor integrated circuit according to an embodiment includes a transfer transistor including a first gate electrode, the first gate electrode and a diffusion layer being diode-connected with a first wiring, and a clock signal line to which a clock signal is supplied, at least a portion of a first partial clock signal line, which is a portion of the clock signal line, being formed above the first gate electrode.

14 Claims, 13 Drawing Sheets

FIG. 7
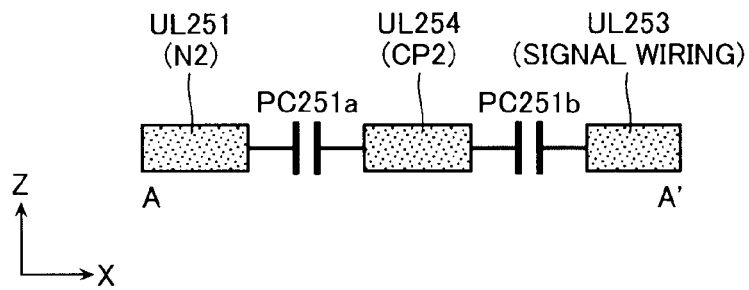
FIG. 9
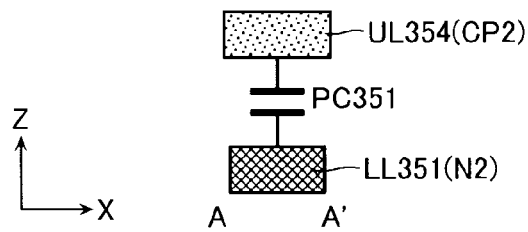
FIG. 10
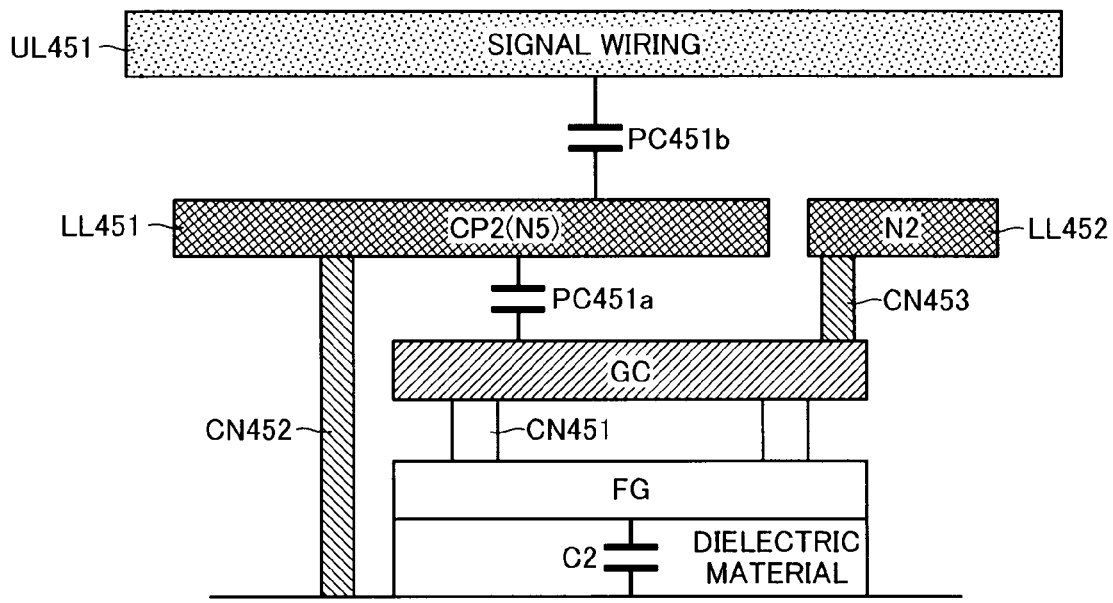

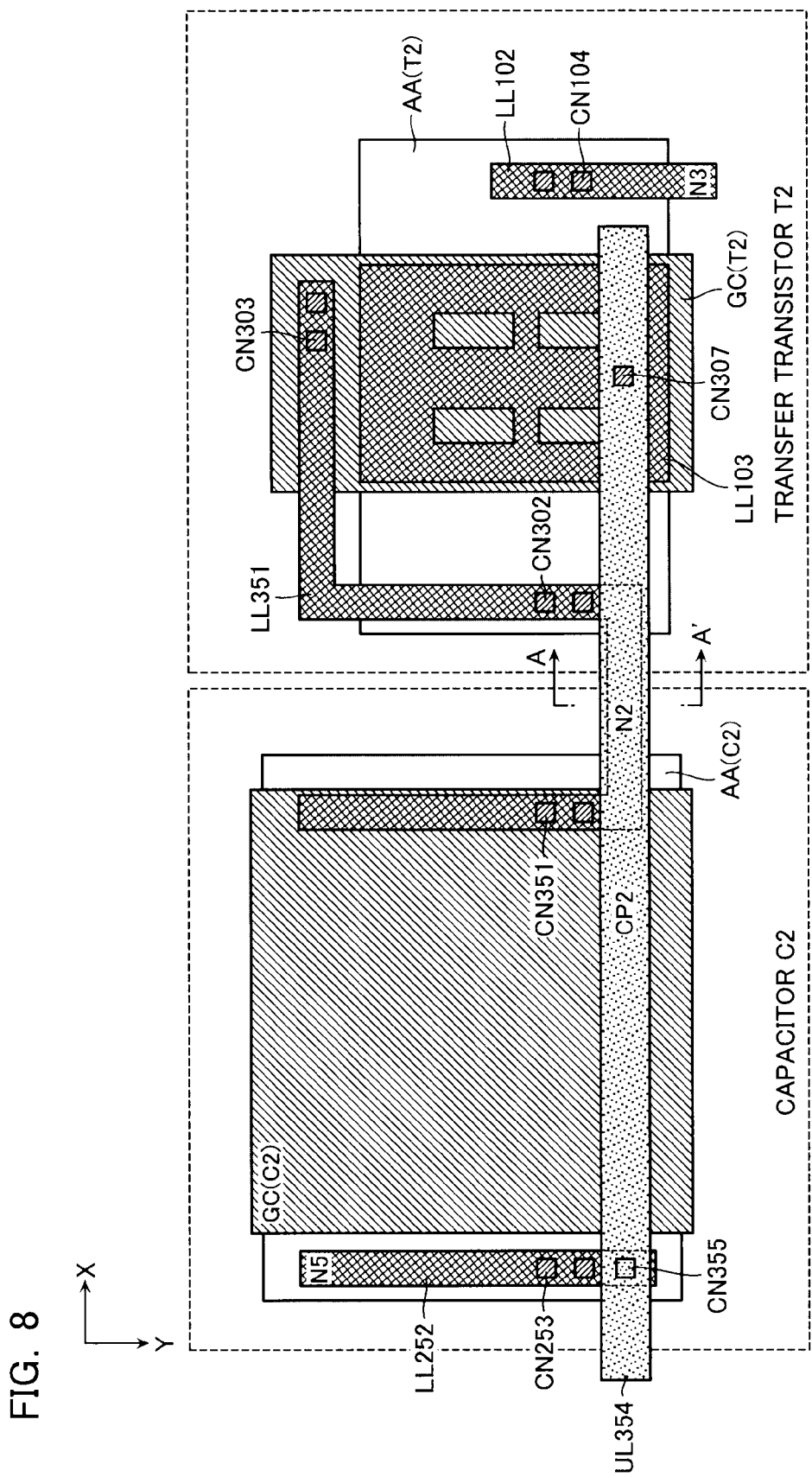

SEMICONDUCTOR INTEGRATED CIRCUIT

CROSS-REFERENCE TO RELATED APPLICATIONS

This application is based upon and claims the benefit of priority from the prior Japanese Patent Application No. 2011-123502, filed on Jun. 1, 2011, the entire contents of which are incorporated herein by reference.

FIELD

Embodiments described herein relate to a semiconductor integrated circuit.

BACKGROUND

A semiconductor storage device such as a NAND type flash memory, i.e., a semiconductor integrated circuit, is required to reduce the chip size more than ever in order to reduce the cost. For this reason, it is preferable for a peripheral circuit other than a memory cell array to have a smaller area and to improve the performance at the same time.

For example, a boosting circuit in a peripheral circuit will be considered. In most cases, the boosting circuit is configured to include multiple capacitors for accumulating charge and multiple transfer transistors for transferring the charge in the capacitors, which are connected in multiple stages. In the boosting circuit, charge in a capacitor is sequentially transferred to capacitors in subsequent stages, so that an input voltage is boosted. Therefore, the performance of the boosting circuit is largely dependent on the capacity of the capacitor.

BRIEF DESCRIPTION OF THE DRAWINGS

FIG. 7 is a cross sectional view taken along A-A' of FIG. 6, and is a figure for explaining a parasitic capacitance of wirings between the transfer transistor and the capacitor in the semiconductor integrated circuit according to the present embodiment;

FIG. 8 is a plan view illustrating a transfer transistor, a capacitor, and wirings between the transfer transistor and the capacitor in a semiconductor integrated circuit according to a third embodiment;

FIG. 9 is a cross sectional view taken along A-A' of FIG. 8, and is a figure for explaining a parasitic capacitance of wirings between the transfer transistor and the capacitor in the semiconductor integrated circuit according to the present embodiment;

FIG. 10 is a cross sectional view illustrating a capacitor in a semiconductor integrated circuit according to a fourth embodiment;

DETAILED DESCRIPTION

A semiconductor integrated circuit according to an embodiment includes a transfer transistor including a first gate electrode, the first gate electrode and a diffusion layer being diode-connected with a first wiring, and a clock signal line to which a clock signal is supplied, at least a portion of a first partial clock signal line, which is a portion of the clock signal line, being formed above the first gate electrode.

Semiconductor integrated circuits according to embodiments will be hereinafter explained with reference to the drawings.

First Embodiment

Figure 1:
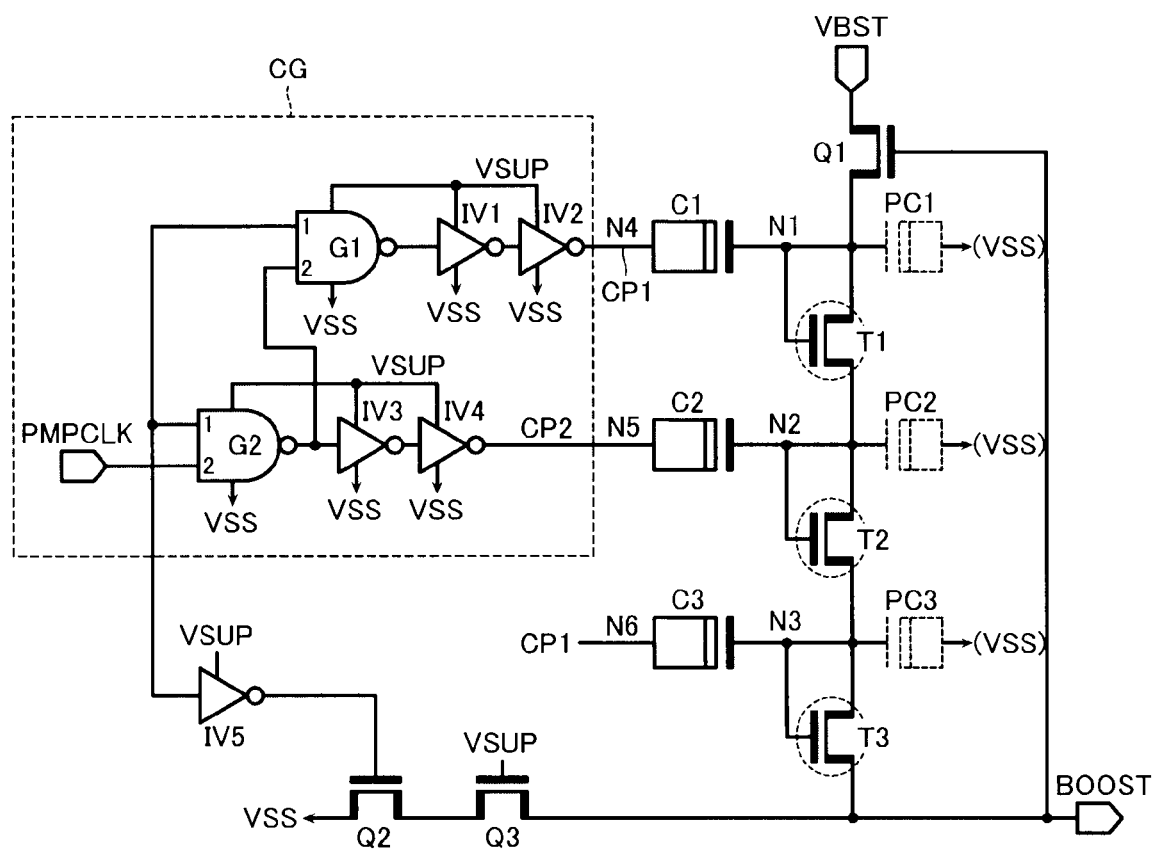
FIG. 1 is a circuit diagram illustrating a portion of a semiconductor integrated circuit according to a first embodiment.

In the first embodiment, a transfer transistor used in a semiconductor integrated circuit is explained using a charge pump (boosting circuit) as shown in FIG. 1.

The charge pump is made by cascade-connecting three NMOS type transfer transistors T1 to T3 whose drain and gate are connected (diode-connected). In the explanation below, transfer nodes of the transfer transistors T1 to T3 made by connecting the drain and the gate will be denoted as N1, N2, N3, respectively. It should be noted that three or more transfer transistors may be provided.

An input voltage VBST is supplied to a transfer node N1 of a transfer transistor T1 in the first stage via an NMOS type transistor Q1. Then, this input voltage VBST is boosted via the transfer transistors T1 to T3, and is output from the source of the transfer transistor T3 in the third stage as output voltage BOOST.

Ends of capacitors C1 to C3 (first capacitors) each having a capacity are connected to the transfer nodes N1 to N3 of the transfer transistors T1 to T3, respectively. Among these, the other ends of the capacitors C1 and C3 receive clock pulses CP1 (clock signals). The other end of the capacitor C2 receives a clock pulse CP2 (clock signal). In the explanation below, the input nodes of the clock pulses CP1 and CP2 of the capacitors C1 to C3 are denoted as N4, N5, N6, respectively.

The clock pulses CP1 and CP2 are generated by a clock pulse generation circuit CG. The clock pulse generation circuit CG has two NAND gates G1 and G2 and four inverters IV1 to IV4. These constituent elements are driven by a supplied voltage VSUP.

The first input of the NAND gate G1 is connected to the first input of the NAND gate G2. The second input of the NAND gate G1 is connected to the output of the NAND gate G2. The output of the NAND gate G1 is connected to an input of the inverter IV1. The output of the inverter IV1 is connected to the input of the inverter IV2. The output of the inverter IV2 is connected to the input node N4 of the capacitor C1. This output of the inverter IV2 is adopted as the clock pulse CP1. Although not shown in the figure, the output of the inverter IV2 is also connected to the input node N6 of the capacitor C3.

The second input of the NAND gate G2 receives a clock pulse PMPCLK provided from outside. The input of the inverter IV3 is connected to the output of the NAND gate G2. The output of the inverter IV3 is connected to the input of the inverter IV4. The output of the inverter IV4 is connected to the input node N5 of the capacitor C2. The output of the inverter IV4 is adopted as the clock pulse CP2.

In the above configuration, the clock pulse generation circuit CG generates the clock pulses CP1 and CP2, having phases opposite to each other, from the clock pulse PMPCLK provided from outside.

In addition to the above configuration, the charge pump includes an inverter IV5 and two NMOS type transistors Q2 and Q3. The input of the inverter IV5 is commonly connected to the first inputs of the NAND gates G1 and G2, and is driven by a supplied voltage VSUP. The source of the transistor Q2 is connected to a ground voltage VSS. The drain of the transistor Q2 is connected to the source of the transistor Q3. The gate of the transistor Q2 is connected to the output of the inverter IV5. The drain of the transistor Q3 is connected to the gate of the transistor Q1, and is driven by a supplied voltage VSUP that is input to the gate of the transistor Q3. The charge pump is activated when the transistor Q2 is turned off.

The charge pump having the above configuration is a three-stage Dickson charge pump. First, charge is accumulated in the capacitor C1 in the first stage with the input voltage VBST. Subsequently, when a predetermined amount of charge is accumulated in the capacitor C1, the transfer transistor T1 in the first stage is turned on. As a result, charge is accumulated in the capacitor C2 in the second stage with the input voltage VBST and discharge of the capacitor C1. Subsequently, when a predetermined amount of charge is accumulated in the capacitor C2, the transfer transistor T2 in the second stage is turned on. As a result, charge is accumulated in the capacitor C3 in the third stage with the input voltage VBST and discharge of the capacitor C2. Finally, when a predetermined charge is accumulated in the capacitor C3, the transfer transistor T3 in the third stage is turned on.

As described above, the input voltage VBST is gradually boosted while it is transferred from the capacitor C1 to the capacitor C3, and finally, the input voltage VBST becomes the output voltage BOOST.

As can be understood from the above operation, the efficiency of the charge pump depends on the charge transfer efficiency achieved with the transfer transistors T1 to T3. However, due to a layout of upper layer wirings, the transfer nodes N1 to N3 of the transfer transistors T1 to T3 may have parasitic capacitances PC1 to PC3 as indicated by dotted lines in FIG. 1. Then, when these parasitic capacitances PC1 to PC3 increase, this reduces the charge transfer efficiency achieved with the transfer transistors T1 to T3. In this case, ends of the parasitic capacitances PC1 to PC3 are connected to the nodes N1 to N3, respectively. On the other hand, the other ends thereof are connected to VSS. However, this configuration is merely an example. The other ends of the parasitic capacitances PC1 to PC3 are signal lines, to which the ground voltage VSS, a power source voltage VDD, a voltage larger than the power source voltage VDD, and a voltage changing between these voltages are given.

Accordingly, the reason why these parasitic capacitances PC1 to PC3 are generated will be subsequently explained.

Figure 11:
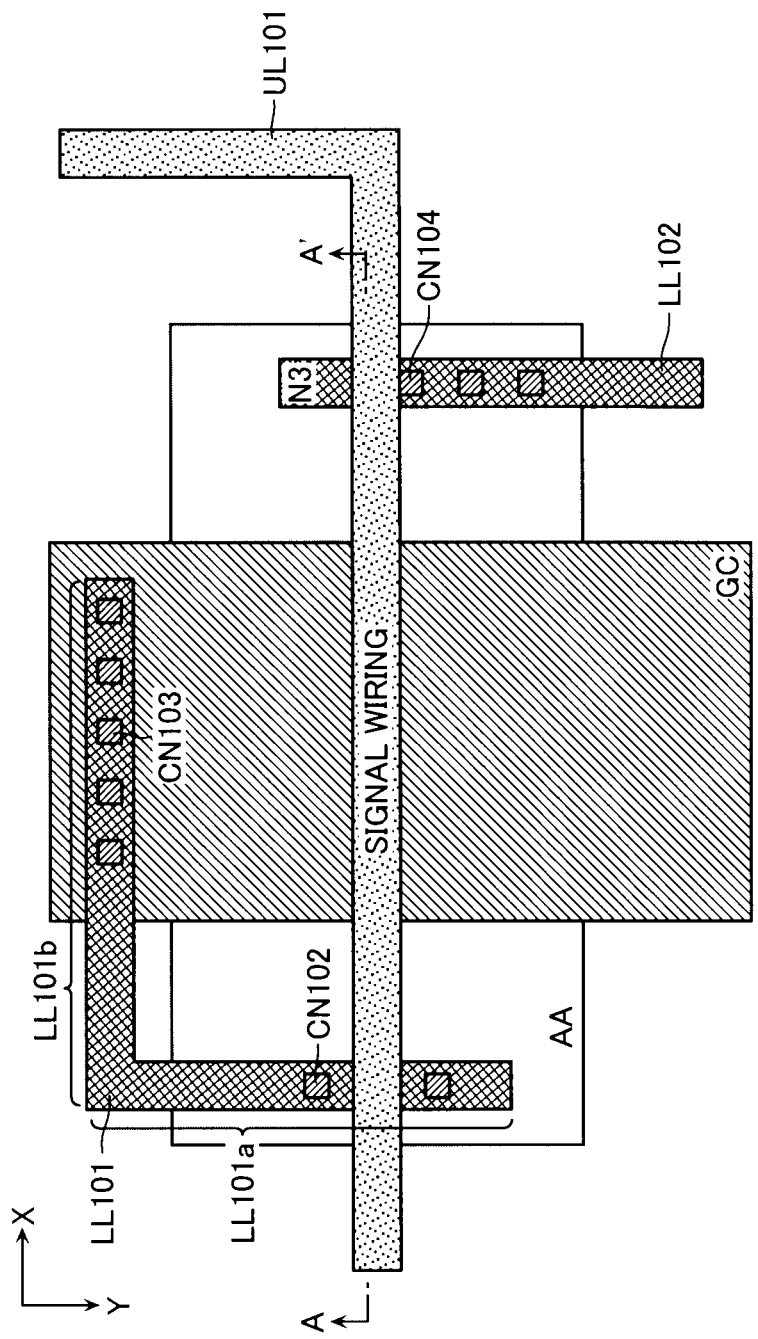
FIG. 11 is a plan view illustrating a transfer transistor in a semiconductor integrated circuit according to a comparative example of the first embodiment.
Figure 12:
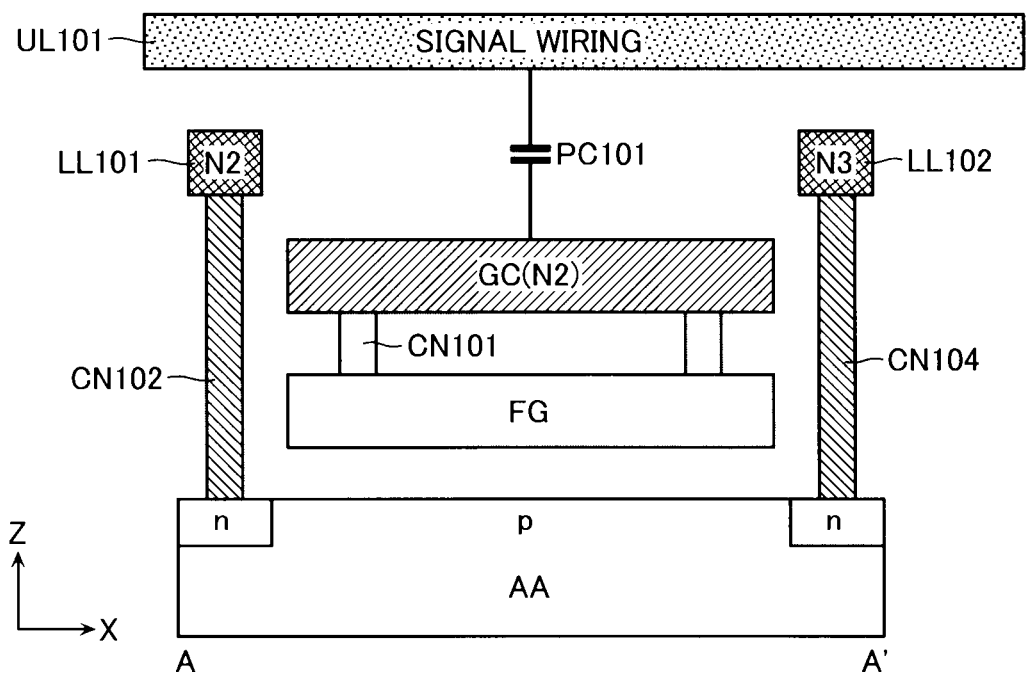
FIG. 12 is a cross sectional view taken along A-A' of FIG. 11, and is a figure illustrating a parasitic capacitance of the transfer transistor in the semiconductor integrated circuit according to the comparative example.

FIG. 11 is a plan view illustrating a transfer transistor according to a comparative example of the present embodiment. FIG. 12 is a cross sectional view taken along A-A' of FIG. 11. It should be noted that FIGS. 11 and 12 show an example of the transfer transistor T2 in the second stage. However, the other transfer transistors T1 and T3 are also the same.

Figure 4:
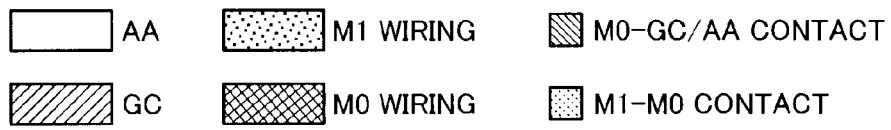
FIG. 4 is a figure illustrating explanatory legends concerning display of FIGS. 2 and 3.

In this case, FIG. 4 shows explanatory legends concerning display of FIGS. 11 and 12. These explanatory legends may also be applied to several other drawings shown below. An explanatory legend "M1 wiring" denotes a metal wiring in the upper layer. Likewise, an "M0 wiring" denotes a metal wiring in a layer lower than the "M1 wiring".

For example, a transfer transistor T2 according to a comparative example is formed above a p type well active region AA. A floating gate FG (first floating gate) and a gate electrode GC (first gate electrode) are sequentially laminated in an active region AA in a Z direction (direction in which the semiconductor integrated circuit is laminated). The gate electrode GC is electrically connected to the floating gate FG via a plurality of contacts CN101. In the active region AA, n type diffusion layers are formed to sandwich the floating gate FG. In this case, the transfer transistor T2 having the laminated gate electrode made by laminating the floating gate FG and the gate electrode GC has been explained as an example. However, the present embodiment explained below may also be applied to a transfer transistor in which a gate electrode includes a single layer.

A lower layer wiring LL101 (first wiring) forming a transfer node N2 is arranged above the active region AA and the gate electrode GC. In this case, the lower layer wiring is, for example, "M0 wiring". The lower layer wiring LL101 includes a partial lower layer wiring LL101a extending in a Y direction (direction perpendicular to the Z direction) above the active region AA and a partial lower layer wiring LL101b extending in the X direction above the active region AA and the gate electrode GC and connected to an end of the partial lower layer wiring LL101a. Among them, the partial lower layer wiring LL101a is electrically connected to the n type diffusion layer formed in the active region AA via a plurality of pillar-shaped contacts CN102 arranged in the Y direction. On the other hand, the partial lower layer wiring LL101b is electrically connected to the gate electrode GC via a plurality of contacts CN103 arranged in an X direction (direction perpendicular to the Y direction and the Z direction). Therefore, the active region AA and the gate electrode GC are electrically connected via the contacts CN102, the lower layer wiring LL101, and the contacts CN103.

Above the active region AA, a lower layer wiring LL102 forming the transfer node N3 is arranged. The lower layer wiring LL102 is arranged at the same position (height) as the lower layer wiring LL101 in the Z direction. The lower layer wiring LL102 is electrically connected to the n type diffusion layer formed in the active region AA via a plurality of pillar-shaped contacts CN104 arranged in the Y direction.

Further, in many cases, as shown in FIG. 12, another general signal wiring UL101 (second wiring) constituting the semiconductor integrated circuit as the upper layer wiring is arranged above the active region AA, the lower layer wiring LL101, the gate electrode GC, and the lower layer wiring LL102. In this case, for example, the upper layer wiring is "M1 wiring". This is because the chip size does not increase when the space above the transfer transistor T2 is made use of. In the case of FIG. 12, the signal wiring UL101 extends in the X direction. In this case, for example, the ground voltage VSS, the power source voltage VDD, a voltage larger than the power source voltage VDD, and a voltage changing between these voltages are given to the signal wiring UL101.

In this case, in the peripheral circuit, the capacities of the capacitors C1 to C3 are decreased in order to reduce the size of area in the peripheral circuit. As a result, the amount of charge that can be transferred to the transfer transistor decreases.

When the wirings are arranged as shown in FIGS. 11 and 12, the parasitic capacitance PC101 is generated between the gate electrode GC and the signal wiring UL101. For example, when a wiring other than the node N2 (for example, the above signal wiring UL101) is arranged above the gate electrode GC, the parasitic capacitance PC101 is generated. The parasitic capacitance PC101 is a portion of the parasitic capacitance PC2 as shown in FIG. 1. When the parasitic capacitance PC2 is generated, adverse effect is caused on the charge transfer efficiency of the transfer transistor T2.

So, the present embodiment is configured such that the transfer transistors are arranged in the following arrangement.

Figure 2:
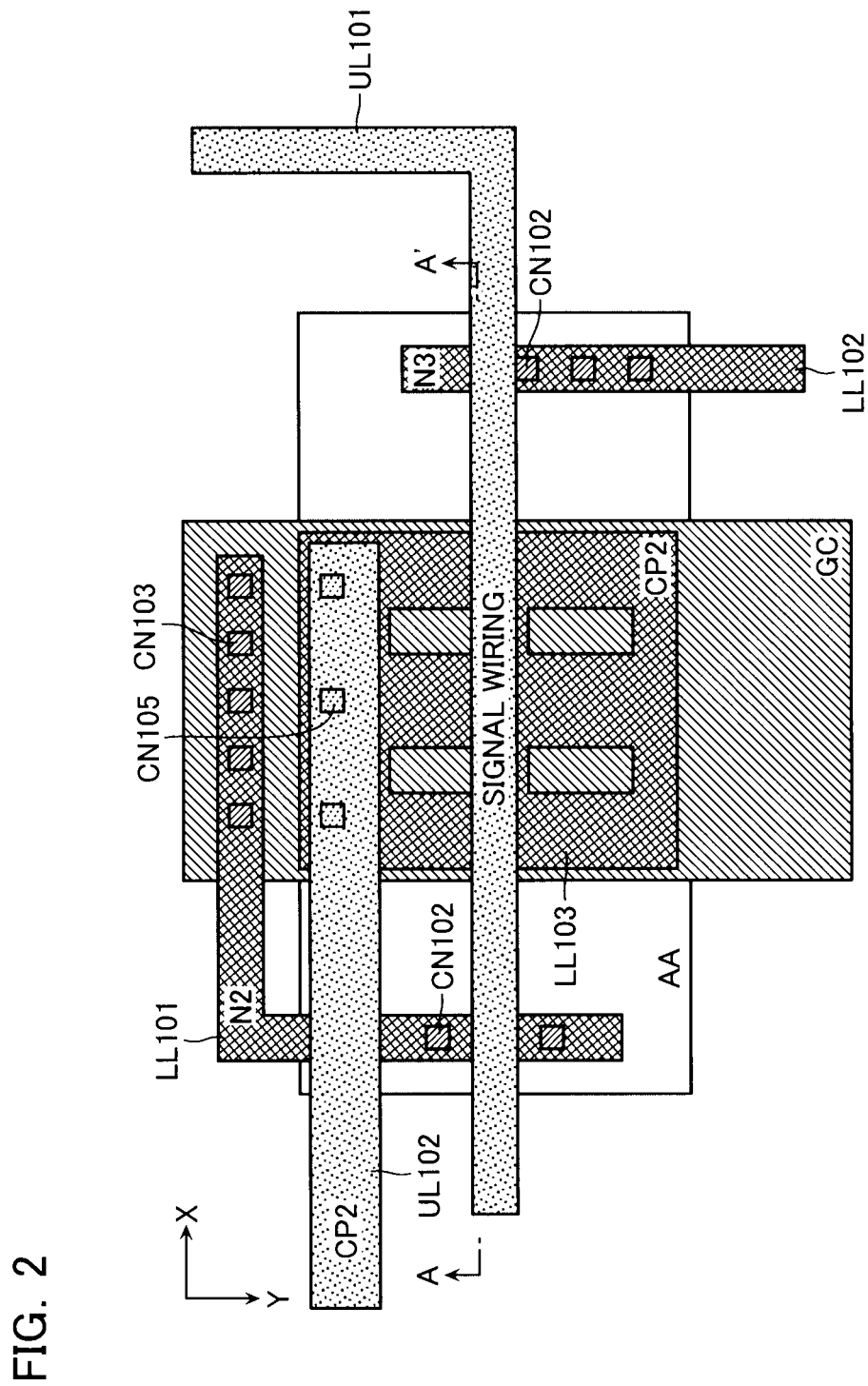
FIG. 2 is a plan view illustrating a transfer transistor in the semiconductor integrated circuit according to the present embodiment.
Figure 3:
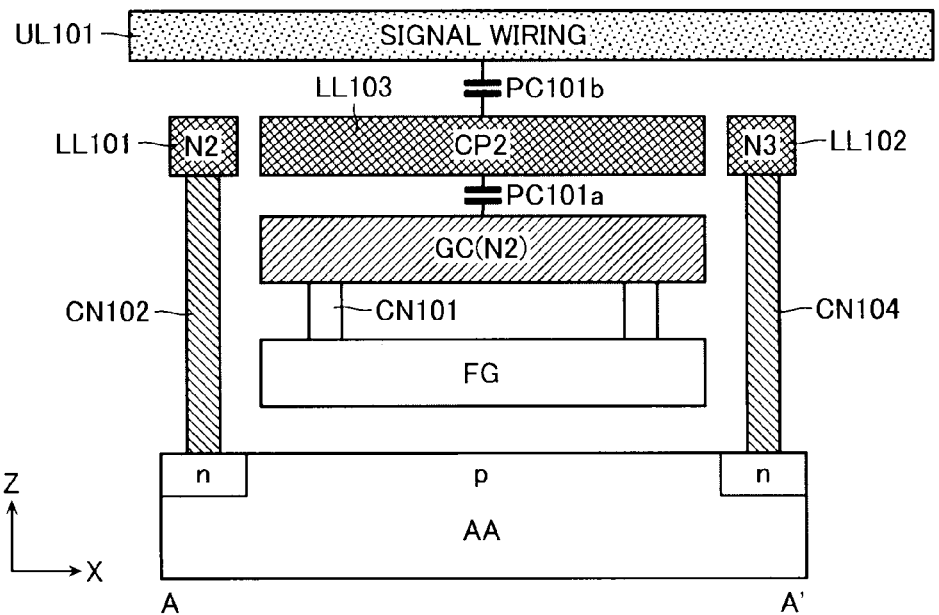
FIG. 3 is a cross sectional view taken along A-A' of FIG. 2, and is a figure for explaining a parasitic capacitance of the transfer transistor in the semiconductor integrated circuit according to the present embodiment.

FIG. 2 is a plan view illustrating a transfer transistor in a semiconductor integrated circuit according to the present embodiment. FIG. 3 is a cross sectional view taken along A-A' of FIG. 2. It should be noted that FIGS. 2 and 3 show an example of the transfer transistor T2 in the second stage. However, the other transfer transistors T1 and T3 are also the same. The same constituent elements as those shown in the comparative example of the present embodiment are denoted with the same reference numerals, and description thereof is omitted.

The semiconductor integrated circuit according to the present embodiment is different from that of the comparative example in the arrangement of the metal wiring supplying a clock pulse CP2.

More specifically, a planar lower layer wiring LL103 (first partial clock signal line) extending in the X direction and the Y direction are arranged in the gate electrode GC. In this case, the lower layer wiring LL103 is formed in the same layer as the lower layer wirings LL101 and LL102.

Further, an upper layer wiring UL102 for supplying the clock pulse CP2 is arranged to extend in the X direction above the active region AA, the lower layer wiring LL101, the gate electrode GC, and the lower layer wiring LL103. The upper layer wiring UL102 is arranged in the same layer as the signal wiring UL101 in the Z direction (this means that, for example, the position of the bottom surface of the upper layer wiring UL102 is substantially the same as the position of the bottom surface of the signal wiring UL101). The upper layer wiring UL102 is electrically connected to the lower layer wiring LL103 via a plurality of contacts CN105 arranged in the X direction.

More specifically, the lower layer wiring LL103 as well as the upper layer wiring UL102 functions as metal wirings to which the clock pulse CP2 is supplied. In other words, a portion of the metal wiring to which the clock pulse CP2 is supplied is arranged between the gate electrode GC and the signal wiring UL101 in the Z direction.

Figure 5:
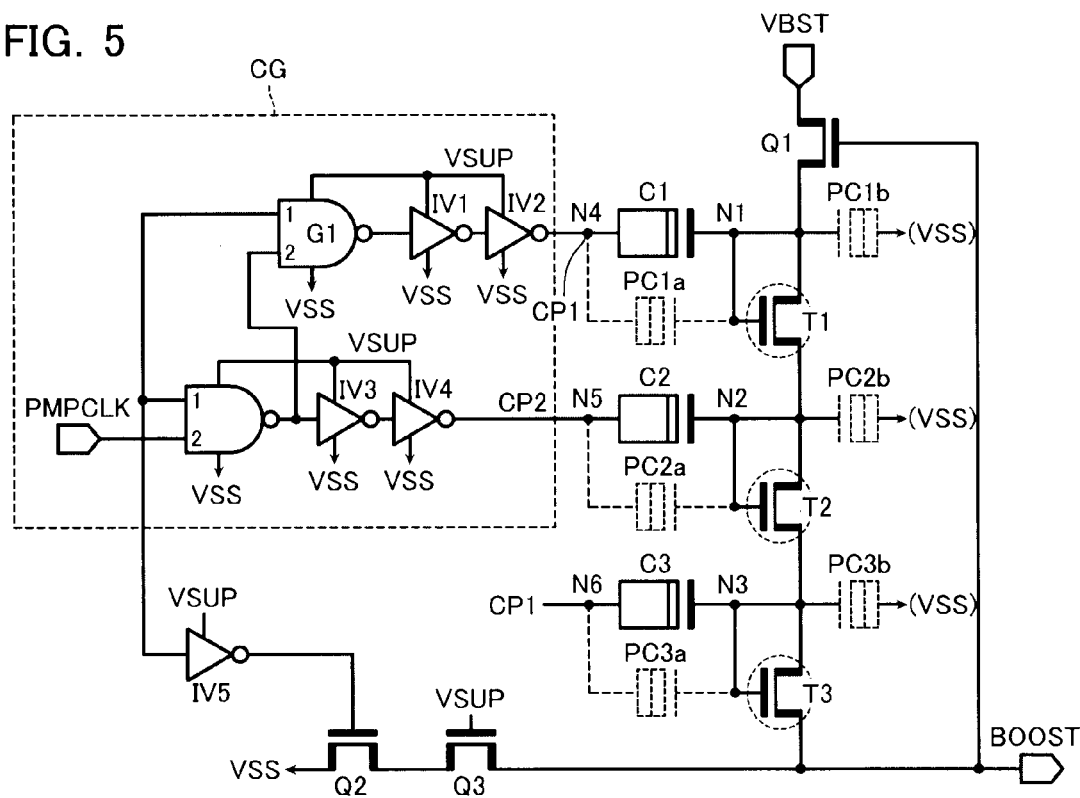
FIG. 5 is an equivalent circuit diagram illustrating a portion of the semiconductor integrated circuit according to the present embodiment.

When the transfer transistor T2 is thus configured in this arrangement, the parasitic capacitances PC101a and PC101b as shown in FIG. 3 are formed. FIG. 5 is an equivalent circuit that reflects the parasitic capacitances PC101a and PC101b in the circuit of FIG. 1.

Among these parasitic capacitances, the parasitic capacitance PC101a is generated between the gate electrode GC and the lower layer wiring LL103. In other words, this becomes the parasitic capacitance PC2a (second capacitor) between the transfer node N2 and the input node N5 as shown in FIG. 5. The parasitic capacitance PC2a is connected in parallel to the capacitor C2 so as to increase the total capacity between the transfer node N2 and the input node N5. As a result, the gate voltage of the transfer transistor T2 tends to easily increase, and the charge transfer efficiency improves due to this increase of the gate voltage. In the explanation below, this effect may be referred to as "assist effect". The parasitic capacitance that increases the total capacity between the transfer node and the input node as described above will be referred to as "assist capacity". It should be noted that the assist effect can be obtained regardless of presence/absence of the signal wiring (e. q. UL101) above the transfer transistor.

On the other hand, the parasitic capacitance PC101b is generated between the lower layer wiring LL103 and the signal wiring UL101. However, the lower layer wiring LL103 also functions as a shield for canceling the electric field generated between the gate electrode GC and the signal wiring UL101. As a result, the effect exerted by the signal wiring UL101 on the gate electrode GC can be reduced to a level less than that of the comparative example. This can suppress the deterioration of the rise of the gate voltage of the transfer transistor T2. In the explanation below, this effect may be referred to as "shield effect".

The present embodiment can be achieved by making use of the space above the transfer transistor. Therefore, the present embodiment can be achieved without increasing the chip size as compared with the comparative example. Further, as described above, when the circuit is designed based on the use of the space above the transfer transistor, the degree of flexibility in the design is enhanced and the chip size can be reduced as compared with the comparative example.

As described above, according to the present embodiment, the semiconductor integrated circuit using the transfer transistors whose charge transfer efficiency is higher than that of the comparative example of the present embodiment can be provided without increasing the chip size.

Second Embodiment

The second embodiment is an embodiment concerning the arrangement of wirings between the transfer transistor and the capacitor.

Before explaining the arrangement of wirings in a semiconductor integrated circuit according to the present embodiment, the arrangement of wirings in a semiconductor integrated circuit serving as a comparative example will be explained first.

Figure 13:
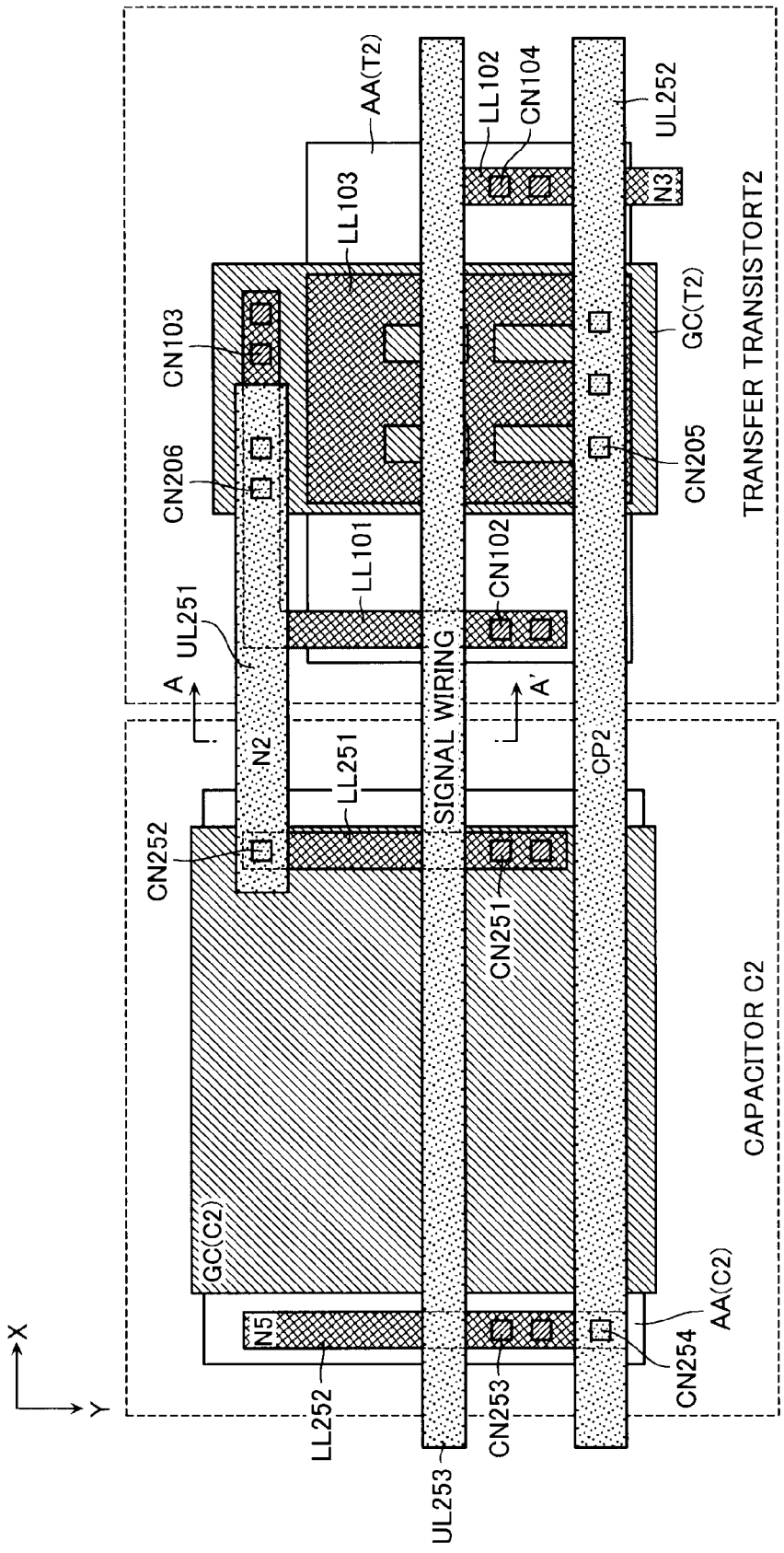
FIG. 13 is a plan view illustrating a transfer transistor, a capacitor, and wirings between the transfer transistor and the capacitor in a semiconductor integrated circuit according to a comparative example of the second embodiment.
Figure 14:
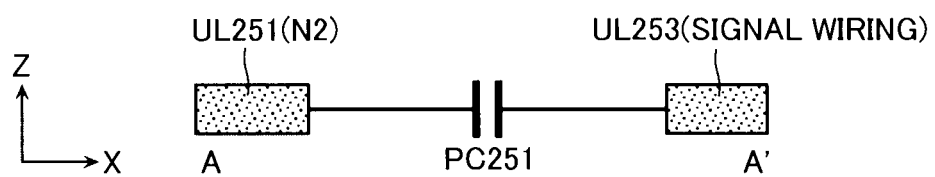
FIG. 14 is a cross sectional view taken along A-A' of FIG. 13, and is a figure for explaining a parasitic capacitance of wirings between the transfer transistor and the capacitor in the semiconductor integrated circuit according to the comparative example.

FIG. 13 is a plan view illustrating a transfer transistor, a capacitor, and wirings between the transfer transistor and the capacitor in the semiconductor integrated circuit according to the comparative example. FIG. 14 is a cross sectional view taken along A-A' of FIG. 13. The same constituent elements as those shown in the first embodiment and the comparative example thereof are denoted with the same reference numerals, and description thereof is omitted.

The transfer transistor T2 according to the comparative example is configured to have the same arrangement as the transfer transistor T2 according to the first embodiment. Therefore, it should be noted that the present comparative example as well as the second embodiment explained below can achieve the same effects as those of the first embodiment.

The capacitor C2 according to the comparative example has a structure of a well capacitor. In other words, the capacitor C2 has an n type well formed on the p-type semiconductor substrate and a gate electrode GC formed on the n type well active region AA. In the explanation below, the active region and the gate electrode of the transfer transistor T2 are denoted with AA (T2), GC (T2), respectively, and the active region and the gate electrode of the capacitor C2 are denoted with AA (C2), GC (C2), respectively.

A lower layer wiring LL251 forming the node N2 is arranged to extend in the Y direction above the gate electrode GC (C2). The lower layer wiring LL251 is electrically connected to the gate electrode GC (C2) via a plurality of contacts CN251 arranged in the Y direction.

An upper layer wiring UL251 (third wiring) forming the transfer node N2 is arranged to extend in the X direction above the gate electrode GC (C2), the lower layer wiring LL251, the active region AA (C2), the lower layer wiring LL101, and the gate electrode GC (T2). The upper layer wiring UL251 is electrically connected to the lower layer wiring LL251 via a contact CN252. The upper layer wiring UL251 is electrically connected to the lower layer wiring LL101 via a plurality of contacts CN206 arranged in the X direction. Therefore, the gate electrodes GC (C2) and GC (T2) are electrically connected via the contact CN251, the lower layer wiring LL251, the contact CN252, the upper layer wiring UL251, the contacts CN206, the contact CN103, and the lower layer wiring LL101.

In other words, in the semiconductor integrated circuit according to the comparative example, the transfer node N2 provided at the height of the lower layer wiring layer in a region of the capacitor C2 is once raised to the height of the upper layer wiring layer at a position between the region of the transfer transistor T2 and the region of the capacitor C2. Then the transfer node N2 returns to the height of the lower layer wiring layer again in a region of the transfer transistor T2. This kind of structure of the transfer node N2 is the same as in the second embodiment explained later.

Above the active region AA (C2), a lower layer wiring LL252 forming the input node N5 is arranged to extend in the Y direction. The lower layer wiring LL252 is electrically connected to the active region AA (C2) via a plurality of contacts CN253 arranged in the Y direction.

An upper layer wiring UL252 (second partial clock wiring) supplying the clock pulse CP2 is arranged to extend in the X direction above the active region AA (C2), the lower layer wiring LL252, the gate electrode GC (C2), the active region AA (T2), the gate electrode GC (T2), and the lower layer wirings LL103 and LL102. The upper layer wiring UL252 is electrically connected to the lower layer wiring LL252 via the contact CN254. The upper layer wiring UL252 is electrically connected to the lower layer wiring LL103 via a plurality of contacts CN205 arranged in the X direction.

Further, another general signal wiring UL253 (second wiring) constituting the semiconductor integrated circuit as the upper layer wiring is arranged to extend in the X direction above the active region AA (C2), the lower layer wiring LL252, the gate electrode GC (C2), the lower layer wiring LL251, the active region AA (T2), the lower layer wiring LL101, the gate electrode GC (T2), and the lower layer wirings LL103 and LL102. The signal wiring UL253 is arranged at the same position (height) as the upper layer wirings UL251 and UL252 in the Z direction and is arranged between the upper layer wirings L251 and UL252 in the Y direction.

According to the semiconductor integrated circuit arranged as described above, as shown in FIG. 14, a parasitic capacitance PC251 is generated between the upper layer wirings UL251 and UL253. The parasitic capacitance PC251 is a portion of the parasitic capacitance PC2 of the transfer node N2, and is a cause of deteriorating the rise of the gate voltage of the transfer transistor T2.

Therefore, the semiconductor integrated circuit according to the present embodiment is configured such that wirings between the transfer transistor and the capacitor are arranged as follows.

Figure 6:
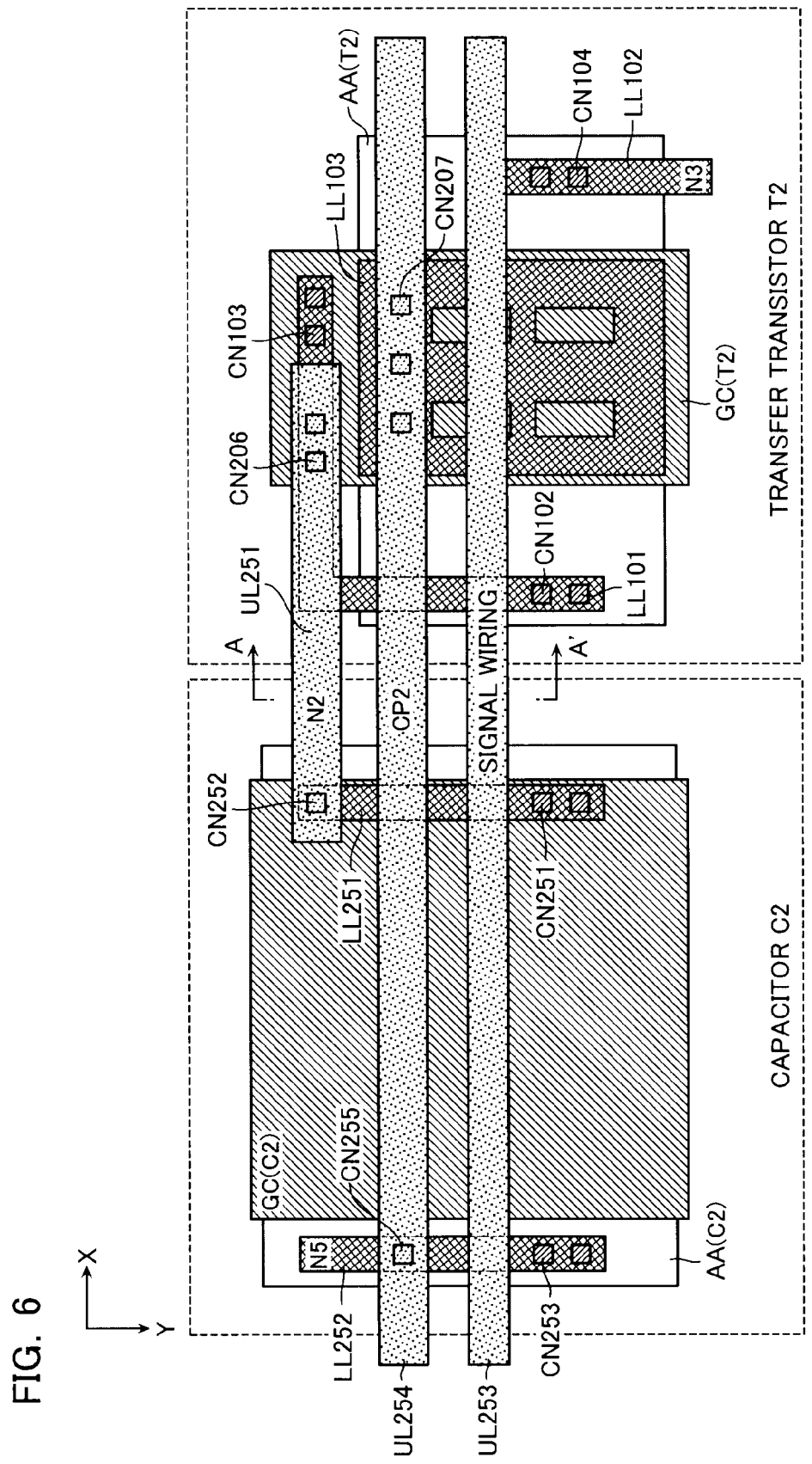
FIG. 6 is a plan view illustrating a transfer transistor, a capacitor, and wirings between the transfer transistor and the capacitor in a semiconductor integrated circuit according to a second embodiment.

FIG. 6 is a plan view illustrating a transfer transistor, a capacitor, and wirings between the transfer transistor and the capacitor in a semiconductor integrated circuit according to the present embodiment. FIG. 7 is a cross sectional view taken along A-A' of FIG. 6. It should be noted that FIGS. 6 and 7 show an example of arrangement of wirings between the transfer transistor T2 and the capacitor C2 in the second stage. However, other wirings, i.e., wirings between the transfer transistor T1 and the capacitor C1 and wirings between the transfer transistor T3 and the capacitor C3 are also the same. The same constituent elements as those shown in the first embodiment, the comparative example thereof, and the comparative example of the present embodiment are denoted with the same reference numerals, and description thereof is omitted.

The semiconductor integrated circuit according to the present embodiment is different from that of the comparative example in the arrangement of the metal wiring supplying a clock pulse CP2.

More specifically, an upper layer wiring UL254 (second partial clock signal line) for supplying the clock pulse CP2 is arranged above the active region AA (C2), the lower layer wiring LL252, the gate electrode GC (C2), the lower layer wiring LL251, the active region AA (T2), the lower layer wiring LL101, the gate electrode GC (T2), and the lower layer wiring LL103. The upper layer wiring UL254 is electrically connected to the lower layer wiring LL252 via a contact CN255. The upper layer wiring UL254 is connected to the lower layer electrode LL103 via a plurality of contacts CN207 arranged in the X direction. Therefore, the lower layer wirings LL252 and LL103 are electrically connected via the contact CN255, the upper layer wiring UL254, and the contact CN207.

The upper layer wiring UL254 is arranged at the same position (height) as the upper layer wirings UL251 and UL253 in the Z direction and is arranged between the upper layer wirings UL251 and UL253 in the Y direction. In this regard, the semiconductor integrated circuit according to the present embodiment is different from that of the comparative example.

Due to this difference from the comparative example, in the present embodiment, as shown in FIG. 7, an assist capacity PC251a and a parasitic capacitance 251b are formed in the wiring between the transfer transistor T2 and the capacitor C2.

Among them, the assist capacity PC251a is generated between the upper layer wirings UL251 and UL254. The total capacity between the transfer node N2 and the input node N5 increases with this assist capacity PC251a. As a result, the assist effect can be obtained which allows the gate voltage of the transfer transistor T2 to easily increase. It should be noted that the assist effect can be obtained regardless of presence/absence of the signal wiring (e. q. UL253) above the transfer transistor and the capacitor.

On the other hand, a parasitic capacitance PC251b is generated between the signal wiring UL253 and the upper layer wiring UL254. With this parasitic capacitance PC251b, the shield effect can be obtained in which a coupling capacitance between the transfer node N2 and the signal wiring UL253 can be cancelled.

The present embodiment can be achieved using the space between the signal wiring and the wiring forming the transfer node. Therefore, as compared with the comparative example, the present embodiment can be achieved without increasing the chip size.

As described above, according to the present embodiment, the semiconductor integrated circuit using the transfer transistors whose charge transfer efficiency is still higher than the comparative example thereof, and the comparative example of the present embodiment can be provided without increasing the chip size.

Third Embodiment

Like the second embodiment, the third embodiment is also an embodiment concerning arrangement of wiring between the transfer transistor and the capacitor.

Before explaining arrangement of wirings in a semiconductor integrated circuit according to the present embodiment, wiring arrangement of a semiconductor integrated circuit serving as a comparative example will be explained first.

Figure 15:
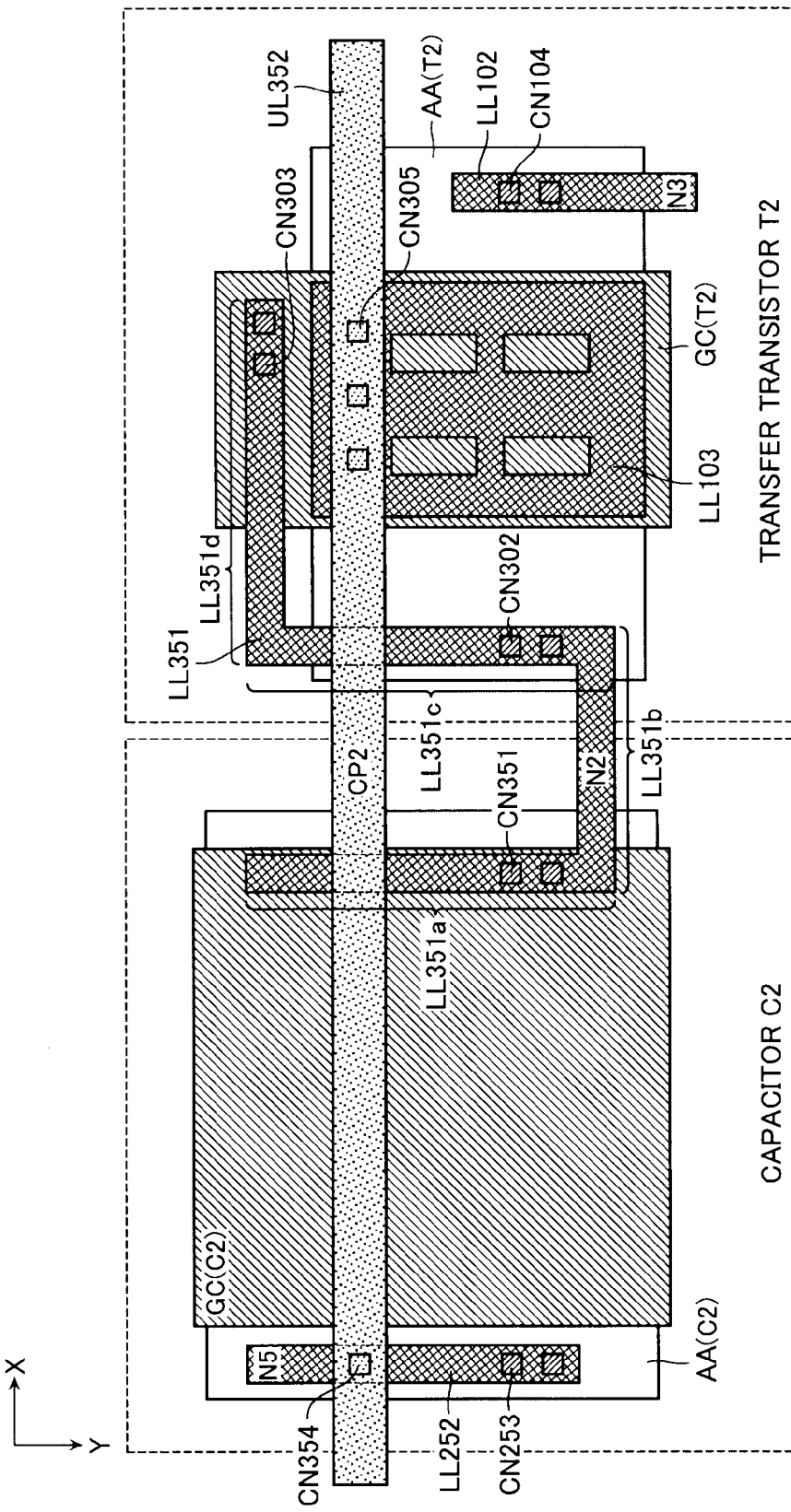
FIG. 15 is a plan view illustrating a transfer transistor, a capacitor, and wirings between the transfer transistor and the capacitor in a semiconductor integrated circuit according to a comparative example of the third embodiment.

FIG. 15 is a plan view illustrating a transfer transistor, a capacitor, and wirings between the transfer transistor and the capacitor in a semiconductor integrated circuit according to the comparative example. The same constituent elements as those shown in the first and second embodiments and the comparative examples thereof are denoted with the same reference numerals, and description thereof is omitted. Since the semiconductor integrated circuit according to the comparative example of the present embodiment is an embodiment concerning a parasitic capacitance generated between a transfer node and a lower layer wiring supplying a clock pulse, FIG. 15 does not show any signal wiring.

The semiconductor integrated circuit according to the comparative example of the present embodiment is different from those of the second embodiment and the comparative example thereof in the shape of a metal wiring forming a transfer node N2 and relationship of arrangement between this metal wiring and the metal wiring supplying the clock pulse.

More specifically, a lower layer wiring LL351 (third wiring) forming the transfer node N2 is arranged above the gate electrode GC (C2), the active regions AA (C2) and AA (T2), and the gate electrode GC (T2). The lower layer wiring LL351 includes partial lower layer wirings LL351a to LL351d. The partial lower layer wiring LL351a is formed above the gate electrode GC (C2) to extend in the Y direction. The partial lower layer wiring LL351a is electrically connected to the gate electrode GC (C2) via a plurality of contacts CN351 arranged in the Y direction. The partial lower layer wiring LL351b is formed above the gate electrode GC (C2) and the active regions AA (C2) and AA (T2) from the end of the partial lower layer wiring LL351a to extend in the X direction. The partial lower layer wiring LL351c is formed above the active region AA (C2) from the end of the partial lower layer wiring LL351b to extend in the Y direction. The partial lower layer wiring LL351c is electrically connected to the active region AA (T2) via a plurality of contacts CN302 arranged in the Y direction. The partial lower layer wiring LL351d is formed above the gate electrode GC (T2) from the end of the partial lower layer wiring LL351c to extend in the X direction. The partial lower layer wiring LL351d is electrically connected to the gate electrode GC (T2) via a plurality of contacts CN303 arranged in the X direction.

Further, an upper layer wiring UL352 for supplying the clock pulse CP2 is arranged to extend in the X direction above the active region AA (C2), the lower layer wiring LL252, the gate electrode GC (C2), the lower layer wiring LL351, the active region AA (T2), the gate electrode GC (T2), and the lower layer wiring LL103. The upper layer wiring UL352 is electrically connected to the lower layer wiring LL252 via a contact CN354. The upper layer wiring UL352 is electrically connected to the lower layer wiring LL103 via a plurality of contacts CN305 arranged in the X direction.

In other words, the semiconductor integrated circuit according to the comparative example is different from those of the second embodiment and the comparative example thereof in that the gate electrodes GC (C2) and GC (T2) are connected by the integrally formed lower layer wiring LL351, and the transfer node N2 does not appear in the upper layer wiring layer.

In the present comparative example, it should be noted that there is less overlapping area between the upper layer wiring UL352 supplying the clock pulse CP2 and the lower layer wiring LL351 forming the transfer node N2 when the circuit is seen from the Z direction.

In contrast, the semiconductor integrated circuit according to the present embodiment is configured such that wirings between the transfer transistor and the capacitor are arranged as follows.

FIG. 8 is a plan view illustrating a transfer transistor, a capacitor, and wirings between the transfer transistor and the capacitor in a semiconductor integrated circuit according to the present embodiment. FIG. 9 is a cross sectional view taken along A-A' of FIG. 8. It should be noted that FIGS. 8 and 9 show an example of arrangement of wirings between the transfer transistor T2 and the capacitor C2 in the second stage. However, other wirings, i.e., wirings between the transfer transistor T1 and the capacitor C1 and wirings between the transfer transistor T3 and the capacitor C3 are also the same. The same constituent elements as those shown in the first and second embodiments, the comparative examples thereof, and the comparative example of the present embodiment are denoted with the same reference numerals, and description thereof is omitted.

The semiconductor integrated circuit according to the present embodiment is different from that of the comparative example in the arrangement of the metal wiring supplying a clock pulse CP2.

More specifically, an upper layer wiring UL354 (third partial clock wiring) for supplying the clock pulse CP2 is arranged above the active region AA (C2), the lower layer wiring LL252, the gate electrode GC (C2), the lower layer wiring LL351, the active region AA (T2), the lower layer wiring LL103, and the gate electrode GC (T2). The upper layer wiring UL354 is electrically connected to the lower layer wiring UL252 via a contact CN355. The upper layer wiring UL354 is also connected to the lower layer wiring LL103 via a contact CN307. Therefore, the lower layer wirings LL103 and LL252 are electrically connected via the contact CN307, the upper layer wiring UL354, and the contact CN355.

In the present embodiment, the overlapping area between the upper layer wiring UL354 supplying the clock pulse CP2 and the lower layer wiring LL351 forming the transfer node N2 is larger than that of the comparative example when the circuit is seen from the Z direction. So, the upper layer wiring UL354 and the partial lower layer wiring LL351b (part of the lower layer wiring LL351) is extending same direction. As a result, the upper layer wiring UL354 almost completely overlaps the partial lower layer wiring LL351b.

The semiconductor integrated circuit according to the present embodiment having the above wiring arrangement has the assist capacity PC351 in the wiring between the transfer transistor T2 and the capacitor C2 as shown in FIG. 9.

The assist capacity PC351 is generated between the upper layer wiring UL354 and the lower layer wiring LL351. The total capacity between the transfer node N2 and the input node N5 increases with this assist capacity PC351. As a result, the assist effect can be obtained which allows the gate voltage of the transfer transistor T2 to easily increase.

The same assist capacity as the assist capacity PC351 is formed in the case of the comparative example, but the comparative example has less overlapping area between the upper layer wiring UL352 and the lower layer wiring LL351. Therefore, the capacity of the comparative example is less than the assist capacity PC351 according to the present embodiment. That is, the comparative example is not expected to have as large an assist effect as the present embodiment.

Conversely, when the overlapping area between the upper layer wiring UL354 and the lower layer wiring UL351 increases like the present embodiment, a large assist effect can be obtained.

As described above, according to the present embodiment, the same effects as those of the first embodiment can be obtained. In addition, a larger assist effect can be obtained. Therefore, the present embodiment can provide the semiconductor integrated circuit using the transfer transistors whose charge transfer efficiency is high.

Fourth Embodiment

The fourth embodiment is an embodiment concerning arrangement of a capacitor. The fourth embodiment can be applied in combination with the first to third embodiments.

FIG. 10 is a cross sectional view illustrating a capacitor according to the present embodiment. It should be noted that FIG. 10 shows an example of the capacitor C2 in the second stage. However, the other capacitors C1 and C3 are also the same.

The capacitor C2 according to the present embodiment (first capacitor) is formed above an n type well active region AA. A floating gate FG (second floating gate) and a gate electrode GC (second gate electrode) are sequentially laminated in the Z direction on the active region AA. A dielectric material is filled between the active region AA and the floating gate FG, whereby the capacitor C2 is formed. The gate electrode GC is electrically connected to the floating gate FG via a plurality of contacts CN451 arranged in the X direction.

A lower layer wiring LL451 (fourth partial clock signal line) forming the input node N5 is arranged above the active region AA and the gate electrode GC. The lower layer wiring LL451 is electrically connected to the active region AA via a pillar-shaped contact CN452.

A lower layer wiring LL452 forming the transfer node N2 is arranged above the active region AA and the gate electrode GC. The lower layer wiring LL452 is electrically connected to the gate electrode GC via a pillar-shaped contact CN453.

Further, another general signal wiring UL451 (fourth wiring) constituting the semiconductor integrated circuit as the upper layer wiring is arranged above the active region AA, the lower layer wiring LL451, the gate electrode GC, and the lower layer wiring LL452.

Like the first embodiment, the capacitor C2 according to the present embodiment has the lower layer wiring LL451 supplying the clock pulse CP2 arranged between the gate electrode GC and the signal wiring UL451 in the Z direction, so that an assist capacity PC451a and a parasitic capacitance PC451b as shown in FIG. 10 are formed.

Among them, the assist capacity PC451a is generated between the gate electrode GC and the lower layer wiring LL451, and is a portion of the assist capacity PC2a between the transfer node N2 and the input node N5 as shown in FIG. 5. That is, with the assist capacity PC451a, the assist effect can be obtained which allows the gate voltage of the transfer transistor T2 to easily increase.

On the other hand, the parasitic capacitance PC451b is generated between the lower layer wiring LL451 and the signal wiring UL451. With the parasitic capacitance PC451b, a shield function for canceling the coupling capacitance generated between the gate electrode GC and the signal wiring UL451 can be obtained.

As described above, when the present embodiment is applied together with the first to third embodiments, the semiconductor integrated circuit using the transfer transistors whose charge transfer efficiency is still higher than those of the first to third embodiments can be provided.

[Adapt to a Nonvolatile Semiconductor Memory Device]

From the first embodiment to the fourth embodiment may adapt to a nonvolatile semiconductor memory device (e, q, NAND-type flash memory).

Figure 16:
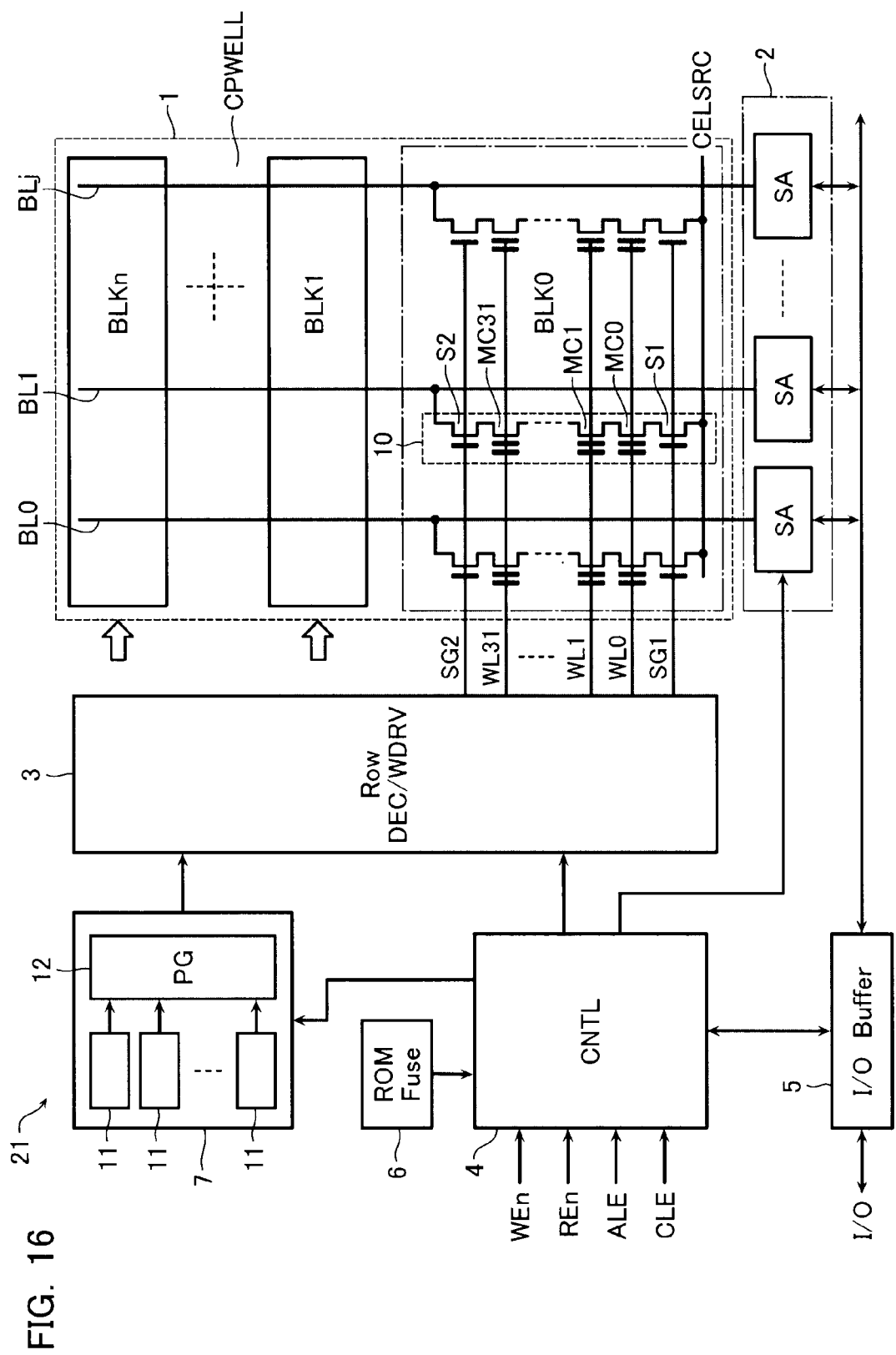
FIG. 16 schematically illustrates a configuration of NAND-type flash memory 21 according to a first embodiment of the present invention.

FIG. 16 schematically illustrates a configuration of NAND-type flash memory 21 according to a first embodiment of the present invention. As illustrated in FIG. 1, the NAND-type flash memory 21 includes a memory cell array 1, a sense amplifier circuit 2, a row decoder 3, a controller 4, an input/output buffer 5, a ROM fuse 6, and a voltage generation circuit 7. The controller 4 represents a control unit for the memory cell array 1.

The memory cell array 1 includes NAND cell units 10 arranged in a matrix form. One NAND cell unit 10 includes a plurality of memory cells MC (MC0, MC1, ..., MC31) connected in series and selection gate transistors S1 and S2 connected to each end of thereof.

Although not illustrated, as well known in the art, one memory cell MC may be a cell that has a floating gate electrode as an electric charge accumulation layer on a gate insulation film (a tunnel insulation film) which is formed between the drain and the source. A control gate electrode is formed on the floating gate electrode via an intergate insulation film. The control gate is connected to one of word lines.

The selection gate transistors S1 have their sources connected to a common source line CELSRC, and the selection gate transistors S2 have their drains connected to bit lines BL.

The control gates of the memory cells MC in each NAND cell unit 10 are connected to different word lines WL (WL0, WL1, ..., WL31), respectively. The gates of the selection gate transistors S1 and S2 are connected to selection gate lines SG1 and SG2 in parallel to the word lines WL, respectively. A set of multiple memory cells sharing one word line are included in one or two pages. A set of multiple NAND cell units 10 sharing the word lines WL, the selection gate lines SG1 and SG2 are included in a block BLK, which is a unit of data erase.

As illustrated in FIG. 1, a plurality of blocks BLK (BLK0, BLK1, ..., BLKn) are included in the memory cell array 1 in the bit line BL direction. The memory cell array 1 including these multiple blocks is formed in one cellwell (CPWELL) of the silicon substrate.

The bit lines BL of the memory cell array 1 are connected to the sense amplifier circuit 2 that has a plurality of sense amplifiers SA including page buffers for sensing read data and storing data to be programmed to the memory cell. The sense amplifier circuit 2 has column selection gates. The row decoder (including a word-line driver) 3 selects and drives word lines WL and selection gate lines SG1, SG2.

The data input/output buffer 5 transmits and receives data between the sense amplifier circuit 2 and an external input/output terminal, and receives other data such as command data or address data. The controller 4 controls the entire memory operation in response to external control signals, such as program enable signals WEn, read enable signals REn, address latch enable signals ALE, or command latch enable signals CLE.

Specifically, the controller 4 includes a command interface as well as address latch and transfer circuits, and determines whether the supplied data is program data or address data. Depending on the results of this determination, program data is transferred to the sense amplifier circuit 2 or address data is transferred to the row decoder 3, the sense amplifier circuit 2, and so on.

The controller 4 also provides sequence control of read/program/erase, control of applied voltage, and so on, based on external control signals.

The voltage generation circuit 7 comprises a plurality of charge pumps (boost circuits) 11 and a pulse generation circuit 12. For example, the charge pumps 11 are charge pump in the first, second, third or fourth embodiments. The voltage generation circuit 7 changes the number of driven boost circuits 11 based on control signals from the controller 4, and further controls the pulse generation circuit 12 to generate a desired pulse voltage. The number of driven boost circuits 11 is changed for the purpose of changing the rise time of the pulse voltage (the degree of waveform bluntness), which will be described later.

Figure 17:
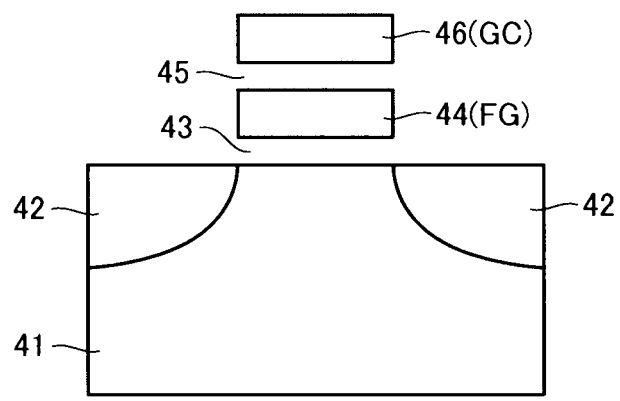
FIG. 17 is sectional views showing a memory cell.

FIG. 17 shows the memory cell. N-type diffusion layers 42 as the source and drain of the memory cell are formed in a substrate 41 (a p-type well region 55 to be described later). A floating gate (FG) 44 is formed on an insulating film 43 on the p-type well region 55. A control gate (GC) 46 is formed on an insulating film 45 on the floating gate 44.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a transfer transistor including a first gate electrode;
   a first conductor including a first partial conductor, the first partial conductor being disposed above the first gate electrode;
   a second conductor including a second partial conductor, the second partial conductor being disposed above the first gate electrode, the second conductor being electrically connected to one end of the transfer transistor; and
   a third conductor including a third partial conductor disposed above the first gate electrode, the third partial conductor being disposed between the first partial conductor and the second partial conductor when seen from a direction in which the semiconductor integrated circuit is laminated;
   a first capacitor whose one end is connected to the first gate electrode and whose other end receives a clock signal,
   wherein a boosting circuit includes the transfer transistor;
   the semiconductor integrated circuit further comprising:
   a fourth conductor connecting the one end of the first capacitor and the first gate electrode; and
   a fifth conductor electrically connected to the third conductor;
   wherein the fifth conductor is arranged in the same layer as the fourth conductor and extends in parallel to the fourth conductor.

2. The semiconductor integrated circuit according to claim 1, further comprising
   a sixth conductor connecting the one end of the first capacitor and the first gate electrode, and
   a seventh conductor electrically connected to the third conductor,
   wherein the seventh conductor is arranged at a position different from the sixth conductor in the direction in which the semiconductor integrated circuit is laminated, and overlaps the sixth conductor when seen from the direction in which the semiconductor integrated circuit is laminated.

3. A semiconductor integrated circuit comprising:
   a transfer transistor including a first gate electrode, the first gate electrode and a diffusion layer being diode-connected with a first wiring; and
   a clock signal line to which a clock signal is supplied,
   at least a portion of a first partial clock signal line, which is a portion of the clock signal line, being formed above the first gate electrode,
   the semiconductor integrated circuit further comprising:
   a second wiring arranged in a layer above the first partial clock signal line and formed above the first gate electrode with the first partial clock signal line interposed therebetween;
   a first capacitor whose one end is connected to the first gate electrode of the transfer transistor and whose other end receives the clock signal,
   wherein a boosting circuit includes the transfer transistor as well as the first capacitor; and
   the semiconductor integrated circuit further comprising:
   a third wiring connecting the one end of the first capacitor and the first gate electrode of the transfer transistor,
   wherein a second partial clock signal line, which is a portion of the clock signal line, is arranged in the same layer as the third wiring and extends in parallel to the third wiring.

4. The semiconductor integrated circuit according to claim 3, further comprising a third wiring connecting the one end of the first capacitor and the first gate electrode of the transfer transistor,
   wherein a third partial clock signal line, which is a portion of the clock signal line, is arranged at a position different from the third wiring in a direction in which the semiconductor integrated circuit is laminated, and overlaps the third wiring when seen from the direction in which the semiconductor integrated circuit is laminated.

5. The semiconductor integrated circuit according to claim 3, wherein the transfer transistor is formed between a well and the first gate electrode and has a first floating gate electrically connected to the first gate electrode.

6. The semiconductor integrated circuit according to claim 3, wherein the first capacitor includes a second floating gate formed on a well, a second gate electrode formed on the second floating gate and electrically connected to the second floating gate, and a dielectric material filled between the well and the second floating gate.

7. The semiconductor integrated circuit according to claim 6, further comprising a fourth wiring formed above the second gate electrode of the first capacitor with a fourth partial clock signal line, which is a portion of the clock signal line, interposed therebetween.

8. A semiconductor integrated circuit comprising:
a transfer transistor including a first gate electrode;
a clock signal line to which a clock signal is supplied;
a first capacitor and a second capacitor arranged in parallel between a gate of the transfer transistor and the clock signal line; and
a second wiring arranged in a layer above a first partial clock signal line, which is a portion of the clock signal line, and formed above the first gate electrode with the first partial clock signal line interposed therebetween, wherein
the second capacitor is configured such that the first gate electrode of the transfer transistor and the first partial clock signal line are used as electrodes, and
the semiconductor integrated circuit further comprising:
a third wiring connecting the first capacitor and the first gate electrode of the transfer transistor,
wherein a second partial clock signal line, which is a portion of the clock signal line, is arranged in the same layer as the third wiring and extends in parallel to the third wiring.

9. The semiconductor integrated circuit according to claim 8, wherein a boosting circuit includes the transfer transistor, the first capacitor, and the second capacitor.

10. The semiconductor integrated circuit according to claim 8, further comprising a third wiring connecting the first capacitor and the first gate electrode of the transfer transistor,
wherein a third partial clock signal line, which is a portion of the clock signal line, is arranged at a position different from the third wiring in a direction in which the semiconductor integrated circuit is laminated, and overlaps the third wiring when seen from the direction in which the semiconductor integrated circuit is laminated.

11. The semiconductor integrated circuit according to claim 8, wherein the transfer transistor is formed between a well and the first gate electrode and has a first floating gate electrically connected to the first gate electrode.

12. The semiconductor integrated circuit according to claim 8, wherein the first capacitor includes a second floating gate formed on a well, a second gate electrode formed on the second floating gate and electrically connected to the second floating gate, and a dielectric material filled between the well and the second floating gate.

13. The semiconductor integrated circuit according to claim 1, further comprising
an eighth conductor that is electrically connected to the third conductor, is disposed above the first gate electrode, and is disposed between the first partial conductor and the first gate electrode when seen from a direction orthogonal to the direction in which the semiconductor integrated circuit is laminated.

14. The semiconductor integrated circuit according to claim 13,
wherein the transfer transistor includes a diffusion layer diode-connected to the first gate electrode by the second conductor,
the eighth conductor has a clock signal supplied thereto, and
at least a portion of the eighth conductor overlaps the first gate electrode when seen from the direction in which the semiconductor integrated circuit is laminated.

* * * * *